(12) United States Patent
Okada (10) Patent No.: US 10,075,162 B2
(45) Date of Patent: Sep. 11, 2018

(54) TOUCH SENSOR UNIT (71) Applicant: Mitsuba Corporation, Gunma (JP)

(72) Inventor: Mitsuhiro Okada, Gunma (JP)

(73) Assignee: Mitsuba Corporation, Kiryu-shi, Gunma (JP)

( * ) Notice: Subject to any disclaimer, the term of this patent is extended or adjusted under 35 U.S.C. 154(b) by 0 days.

(21) Appl. No.: 15/543,600

(22) PCT Filed: Dec. 9, 2015

(86) PCT No.: PCT/JP2015/084480
§ 371 (c)(1),
(2) Date: Jul. 14, 2017

(87) PCT Pub. No.: WO2016/121235
PCT Pub. Date: Aug. 4, 2016

(65) Prior Publication Data
US 2018/0013427 A1 Jan. 11, 2018

(30) Foreign Application Priority Data
Jan. 26, 2015 (JP) .................................. 2015-011991

(51) Int. Cl.
*H03K 17/955* (2006.01)
*H03K 17/96* (2006.01)
(52) U.S. Cl.
CPC ......... *H03K 17/955* (2013.01); *H03K 17/962* (2013.01)
(58) Field of Classification Search
CPC .... H03K 17/955; H03K 17/962; H01H 3/142; H01H 1/06; H01H 13/02; H01H 3/16;
(Continued)

(56) References Cited

U.S. PATENT DOCUMENTS

| 5,554,835 A * | 9/1996 | Newham ................ G08B 21/22 200/512 |
| 2010/0006407 A1* | 1/2010 | Masuko ................. H01H 3/142 200/61.44 |
| 2015/0303008 A1* | 10/2015 | Yujima .................. H01H 3/142 200/52 R |

FOREIGN PATENT DOCUMENTS

CN 104070971 A 10/2014
JP 2006118200 A 5/2006
(Continued)

OTHER PUBLICATIONS

International Search Report for PCT Serial No. PCT/JP2015/084480 dated Feb. 12, 2016.

*Primary Examiner* — Edwin A. Leon
(74) *Attorney, Agent, or Firm* — McCormick, Paulding & Huber LLP (57) ABSTRACT

First and second bridging portions (63*a* and 63*b*) is disposed so as to form a shock absorbing space (63*c*) between the sensor accommodating portion (61) and the fixing portion (62), and elastically deformed by external force, and the paired bridging portions (the shock absorbing space (63*c*)) is caused to function as a shock absorbing portion (63). Furthermore, the sensor accommodating portion (61) is thinner than each of the bridging portions (63*a* and 63*b*), after the sensor accommodating portion (61) is elastically deformed and a contact of a blockage is detected, the first and second bridging portions (63*a* and 63*b*) can be elastically deformed to absorb a shock. Therefore, it is possible to significantly reduce a load on the blockage in comparison with the conventional technique. Since the drive unit is reversely driven after shock absorption, it is possible to reduce the load on the drive unit and so forth, and to inhibit the occurrence of inconvenience such as burning.

5 Claims, 9 Drawing Sheets

(58) Field of Classification Search
CPC . H01H 35/00; H01H 3/14; E05F 15/44; E05F 15/646; E05Y 2900/531
USPC .................. 200/600, 505, 52 R, 86 R, 61.44
See application file for complete search history.

(56) References Cited

FOREIGN PATENT DOCUMENTS

| | | |
|---|---|---|
| JP | 2007-35349 A | 2/2007 |
| JP | 2010-272277 A | 12/2010 |

* cited by examiner

TOUCH SENSOR UNIT

CROSS-REFERENCE TO RELATED APPLICATIONS

This application is a National Stage application of International Patent Application No. PCT/JP2015/084480, filed on Dec. 9, 2015, which claims priority to Japanese Patent Application No. 2015-011991, filed on Jan. 26, 2015, each of which is hereby incorporated by reference in its entirety.

TECHNICAL FIELD

The present invention relates to a touch sensor unit which detects a contact of a blockage.

BACKGROUND ART

Conventionally, an automatic opening and closing apparatus provided in a vehicle such as automotive vehicle includes: an opening and closing body which opens and closes an opening portion; an electric motor which drives the opening and closing body; and an operation switch which turns the electric motor ON/OFF. With the operation switch operated by an operator, the electric motor is driven, thereby causing the opening and closing body to be moved in a closing direction or an opening direction.

In the automatic opening and closing apparatus, the opening and closing body is also driven on the basis of conditions other than the operation of the operation switch. For example, the automatic opening and closing apparatus includes: a touch sensor unit which detects that a blockage is interposed between the opening portion and the opening and closing body. The touch sensor unit is fixed to the opening portion or the opening and closing body. The touch sensor unit includes a cable sensor. When a blockage makes contact with this cable sensor, a controller of the automatic opening and closing apparatus recognizes the contact of the blockage, and controls the electric motor irrespective of the operation of the operation switch. Specifically, the controller performs a control to cause the opening and closing body moving in the closing direction to be moved in the opening direction or to be halted on the spot.

Figure 9:
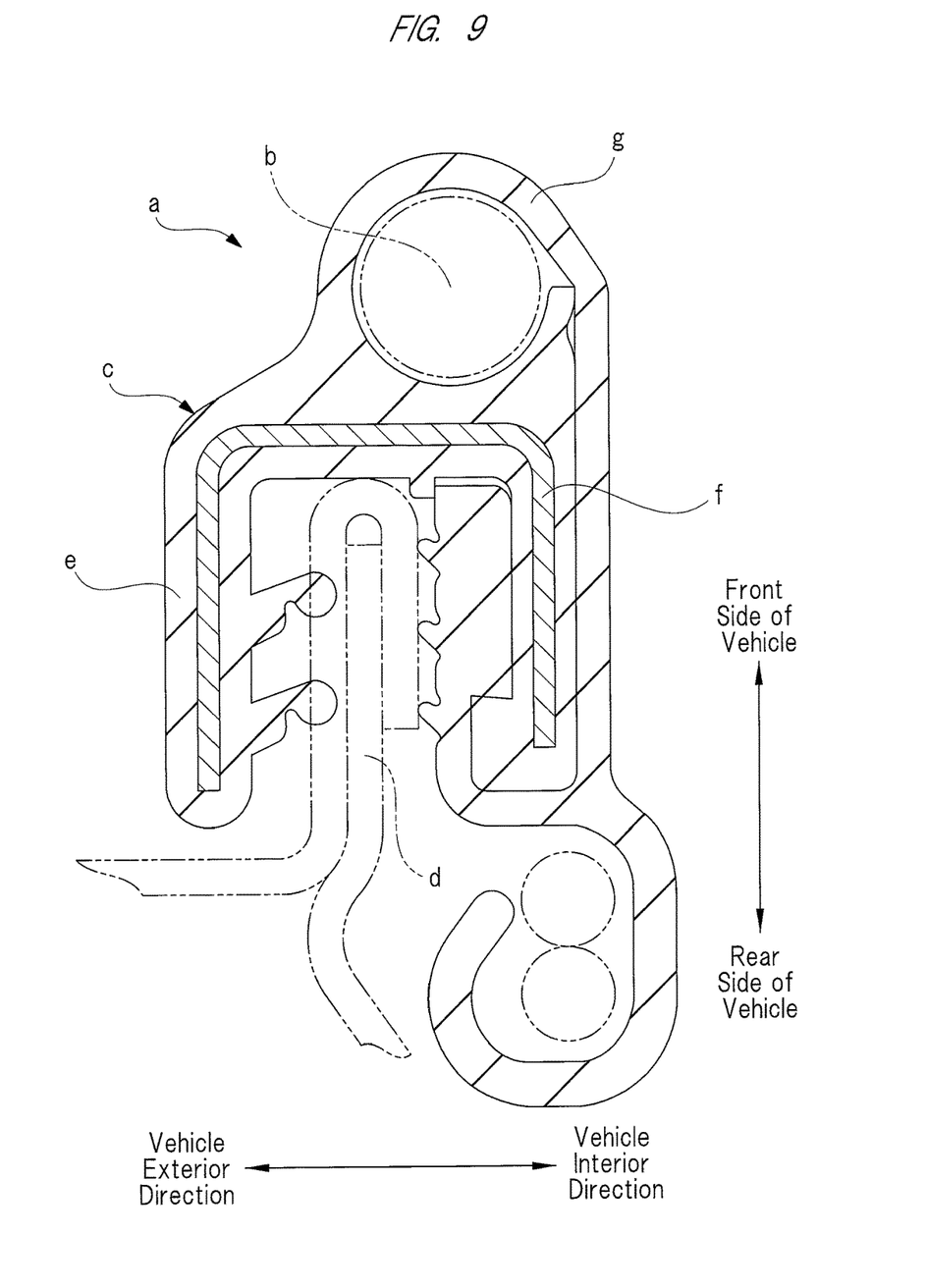
FIG. 9 is a sectional view of the structure of the touch sensor unit of the related art.

One example of the touch sensor unit for this automatic opening and closing apparatus is disclosed in Japanese Patent Application Laid-Open Publication No. 2010-272277 (FIG. 4). FIG. 9 is a sectional view showing the structure of the touch sensor unit of the related art. A touch sensor unit "a" includes: a cable sensor "b" including a plurality of electrodes (not shown) which are caused to electrically make contact with one another by application of an external force; and a sensor holder "c" which holds the cable sensor "b". The sensor holder "c" is formed of flexible insulating rubber material or the like, and has: a fixing portion "e" for fixing the cable sensor "b" to a door mount stay "d". The fixing portion "e" has a section formed into a U-shape, and a core rod "f" is buried (inserted) in the fixing portion "e", thereby ensuring fixing stiffness of the touch sensor unit "a" with respect to the mount stay "d". Also, the cable sensor "b" is held by a sensor holding portion "g" in the vicinity of the core rod "f" on a front side (upper side in FIG. 9) of the vehicle body.

SUMMARY

Incidentally, when the cable sensor is elastically deformed by application of an external force, the electrodes of the cable sensor are respectively caused to make contact with each other. Therefore, the controller recognizes a contact of a blockage, and on the basis of this detection, the electric motor is caused to be halted or reversed. In practice, however, an inertial force of the door, control delay, or the like results in a time lag between the halt or reverse rotation of the electric motor and the halt or reverse operation of the door. Therefore, a load on the blockage when the door is halted or reversed is larger than a load for elastically deforming the cable sensor.

In this case, in particular, when the moving speed of the door in the closing direction is fast, since the inertial force of the door is large, the load on the blockage tends to become large. Also, an automatic opening and closing apparatus of a type in which the door is pulled by a cable, is provided with a tensioner mechanism which absorbs changes in circumferential length of the cable, that is, sag of the cable. Therefore, the door moves by the inertial force superfluously by the operation of the tensioner mechanism, and in turn, the load on the blockage tends to become larger.

An object of the present invention is to provide a touch sensor unit capable of reducing a load on a blockage.

According to one aspect of the present invention, there is provided a touch sensor unit for detection of contact with a blockage, comprising: a cable sensor having electrodes which are brought into electrical contact with each other by external force; a sensor accommodating portion in which the cable sensor is accommodated, and which is deformed by external force; a fixing portion integrally provided to the sensor accommodating portion, and fixed to a fixing object, and a pair of bridging portions disposed so as to form a gap between the sensor accommodating portion and the fixing portion, and elastically deformed by external force, wherein the sensor accommodating portion has a thickness dimension along a direction crossing a longitudinal direction of the cable sensor, the thickness dimension being thinner than a thickness dimension of the bridging portions along the direction crossing the longitudinal direction of the cable sensor.

According to another aspect of the present invention, the fixing object is an opening and closing body which opens and closes an opening portion, and the fixing portion includes: a base portion formed between inside and outside of the opening and closing body; a first extending portion extending in a moving direction of the opening and closing body on an inside of the opening and closing body; and a second extending portion extending in the moving direction of the opening and closing body on an outside of the opening and closing body.

According to another aspect of the present invention, the base portion is tilted so that the first extending portion is disposed near a rear end along a closing direction of the opening and closing body, and the second extending portion is disposed near a front end along the closing direction of the opening and closing body, and the paired bridging portions and the sensor accommodating portion are disposed near the first extending portion of the base portion.

According to another aspect of the present invention, one of the paired bridging portions is provided to a corresponding portion of the first extending portion along the moving direction of the opening and closing body, and the other of the paired bridging portions is provided to a corresponding portion of the base portion along the moving direction of the opening and closing body.

According to another aspect of the present invention, a core rod is buried in the fixing portion.

According to the present invention, since a pair of bridging portions is disposed so as to form a shock absorbing gap between the sensor accommodating portion and the fixing portion, and elastically deformed by external force, it is possible to cause the paired bridging portions (and the gap) to function as a shock absorbing portion. Furthermore, since the sensor accommodating portion is thinner than each bridging portion, after the sensor accommodating portion is elastically deformed and a contact of a blockage is detected, the paired bridging portions can be elastically deformed to absorb a shock, it is possible to significantly reduce a load on the blockage in comparison with the conventional technique. At this moment, since the electric motor is, for example, reversely driven after shock absorption, it is possible to reduce the load on the electric motor and so forth, and to inhibit the occurrence of inconvenience such as burning.

DETAILED DESCRIPTION

Hereinafter, one embodiment of the present invention will be described with reference to the accompanying drawings.

Figure 1:
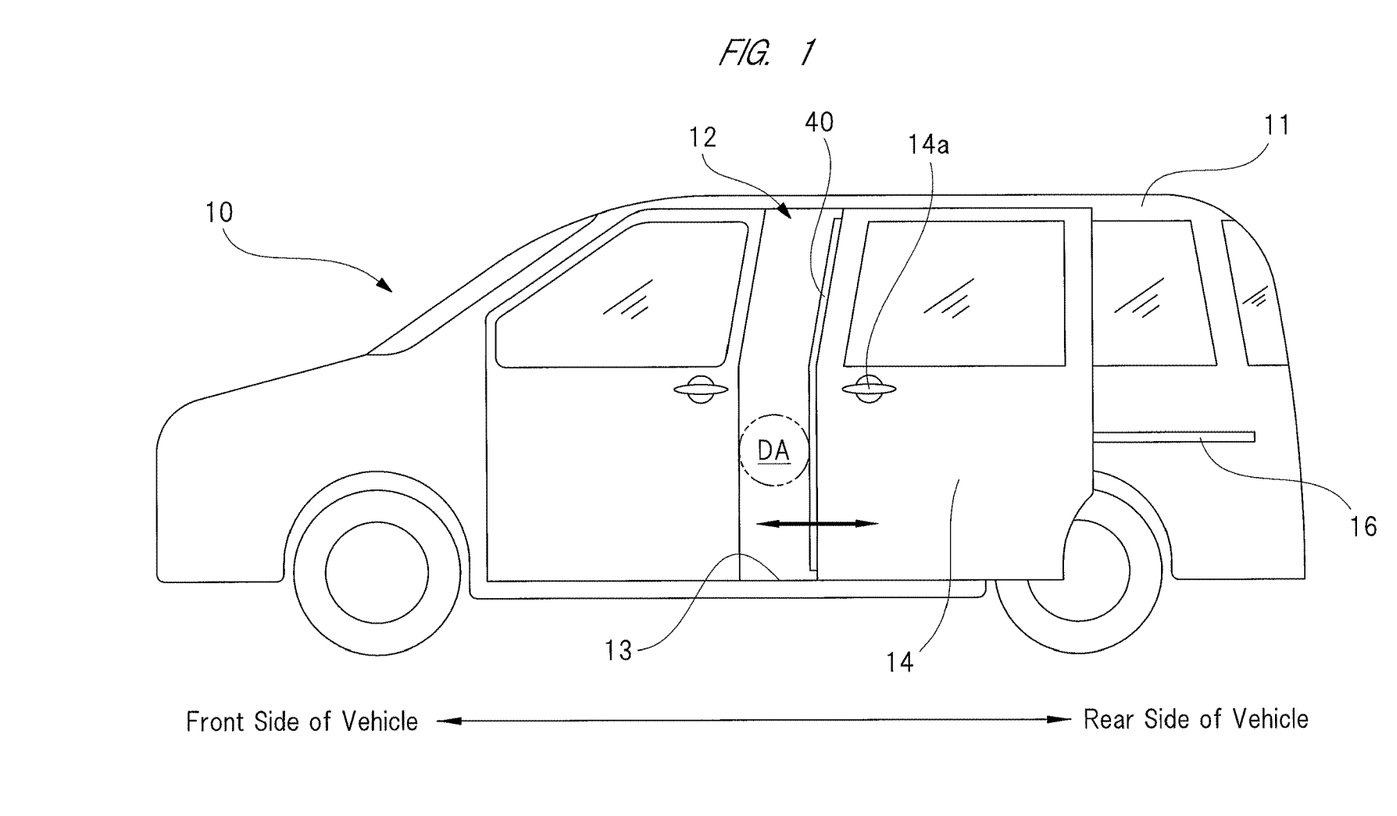
FIG. 1 is a side view showing a vehicle including a touch sensor unit according to the present invention.
Figure 2:
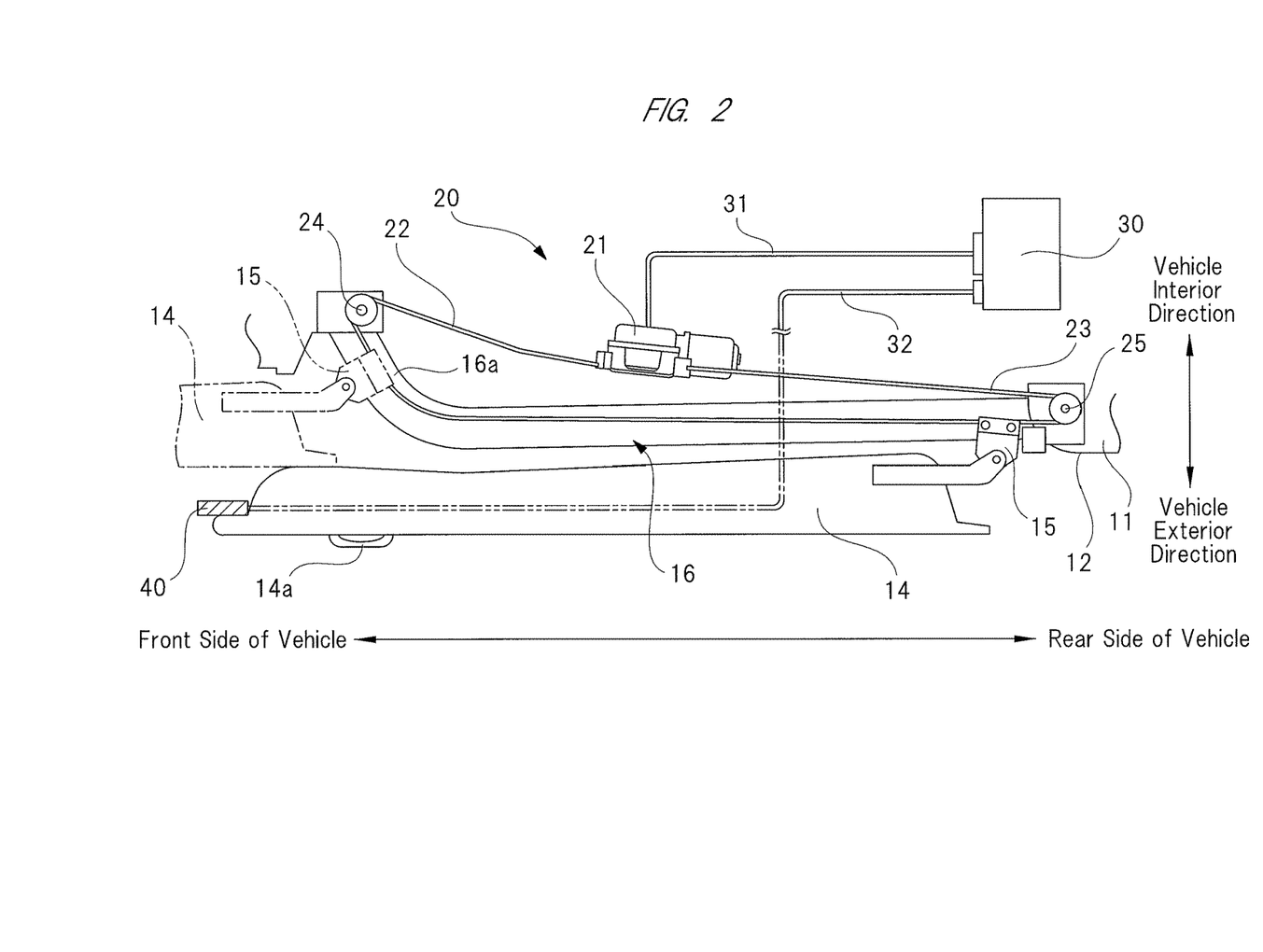
FIG. 2 is a diagram describing the structure of an automatic opening and closing apparatus provided to the vehicle.
Figure 3:
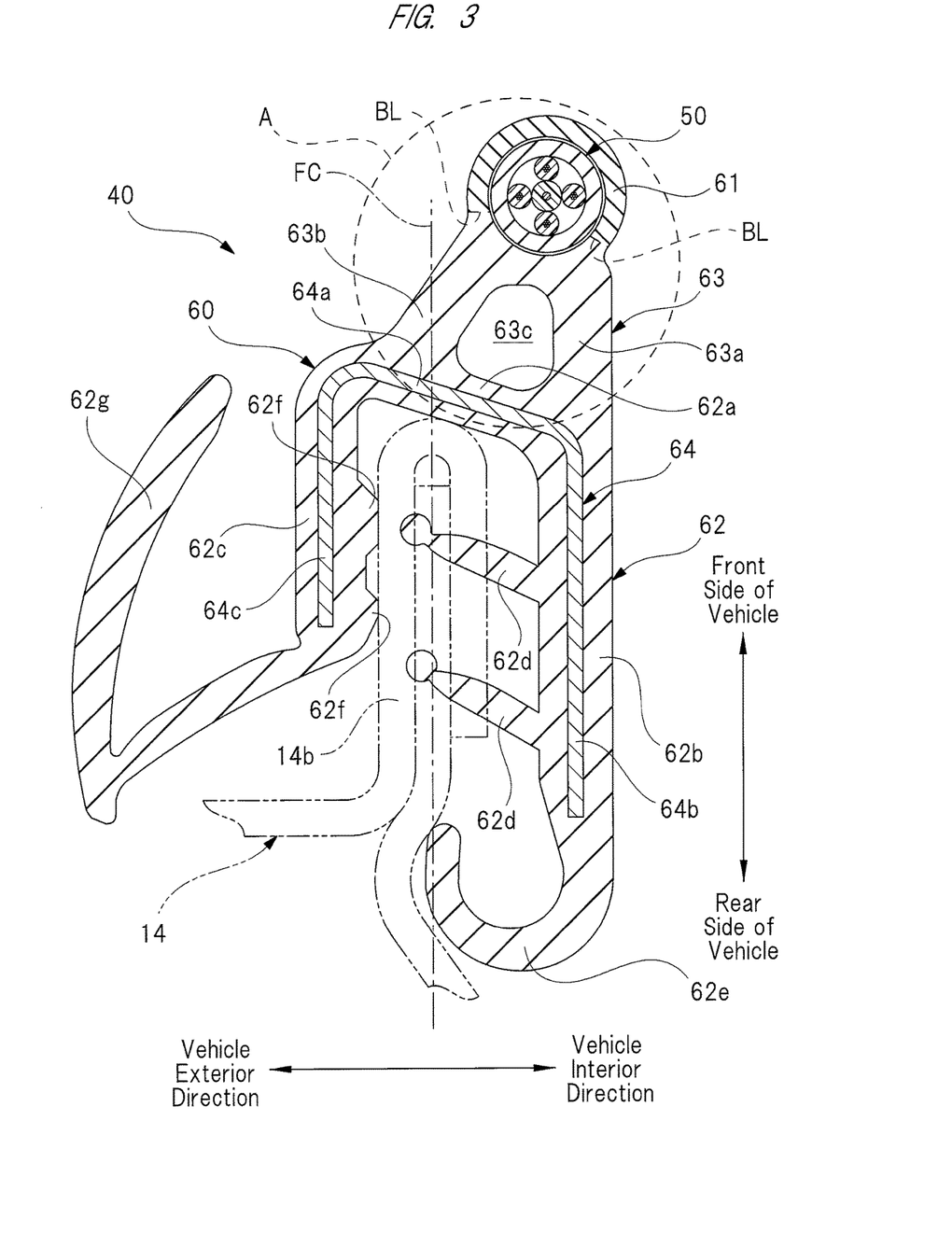
FIG. 3 is a sectional view showing the structure of the touch sensor unit.
Figure 4:
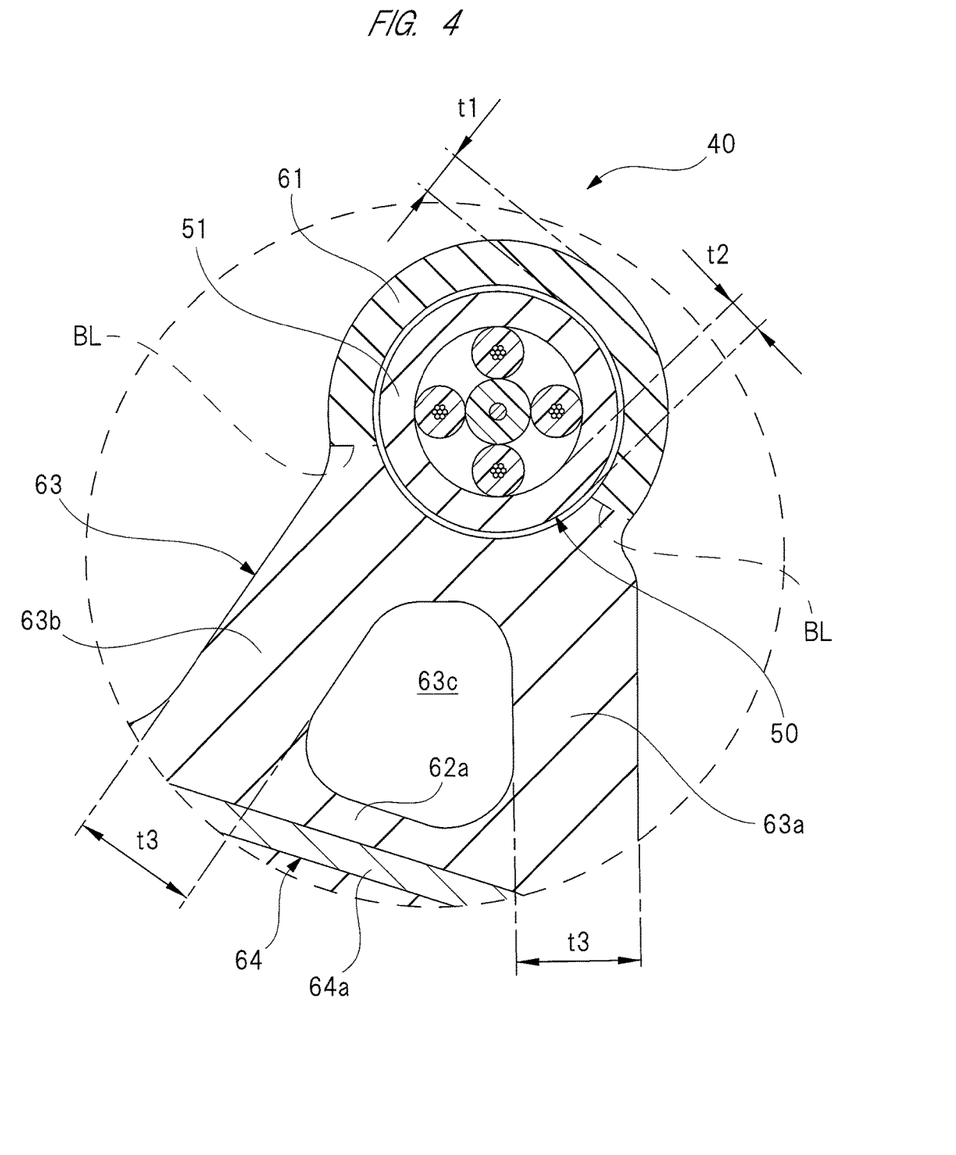
FIG. 4 is an enlarged sectional view showing a portion surrounded by a broken-line circle "A" of FIG. 3.
Figure 5:
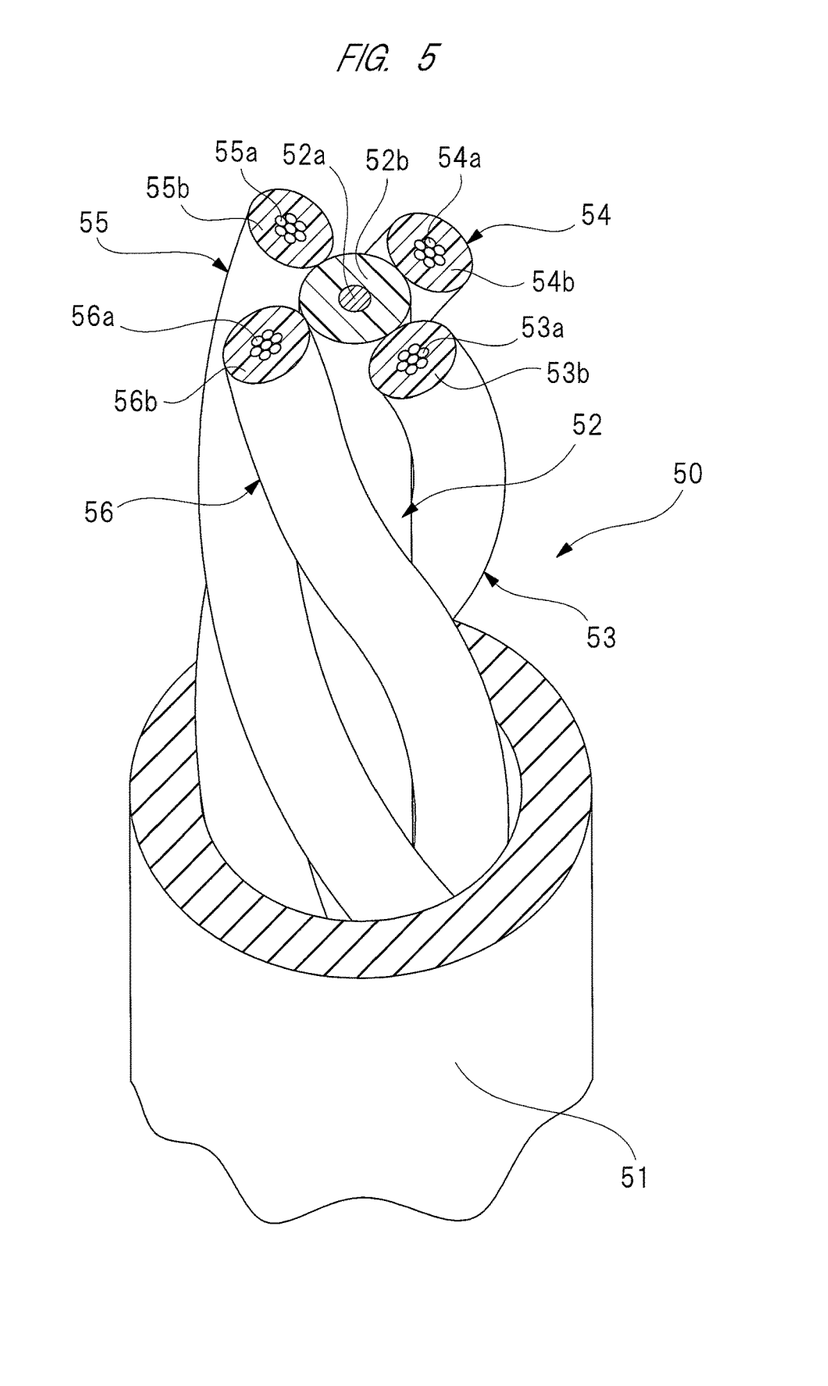
FIG. 5 is a perspective view showing the structure of a cable sensor.
Figure 6:
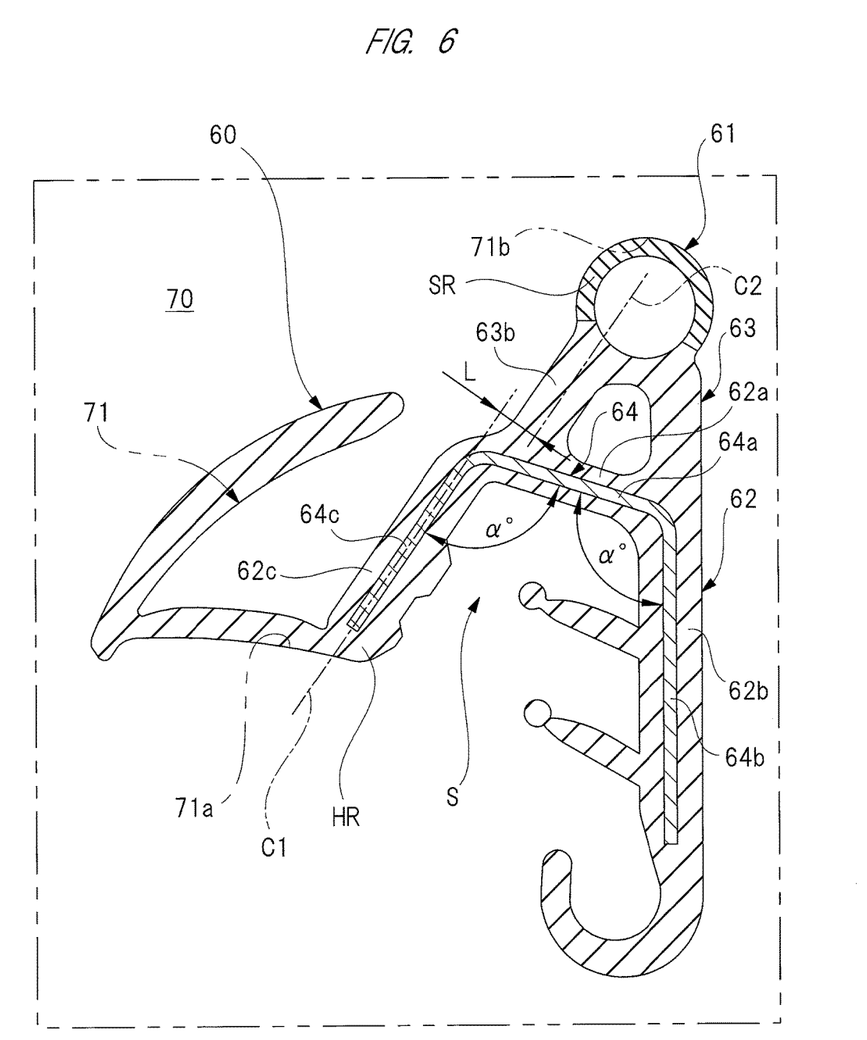
FIG. 6 is a diagram describing the shape of a sensor holder after injection molding.
Figure 7A:
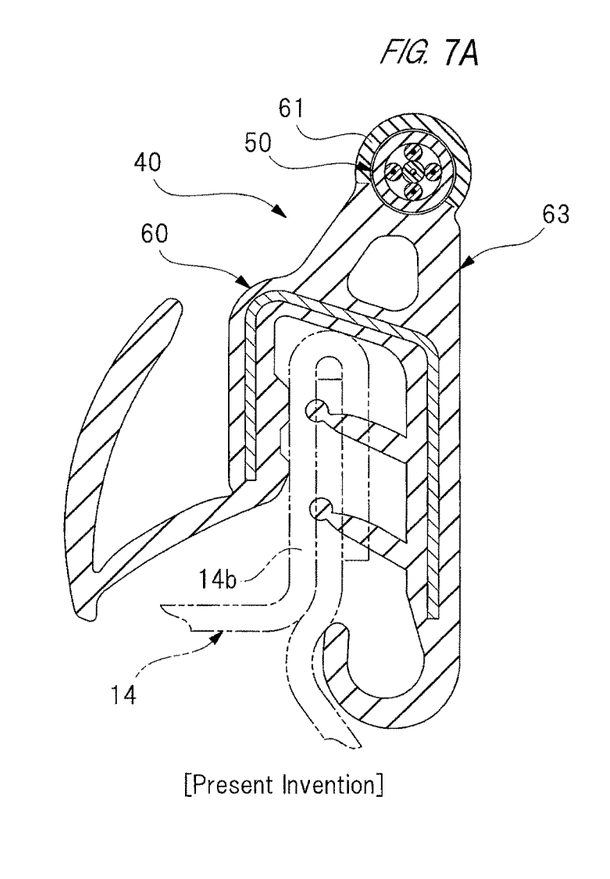
FIG. 7A is a sectional view showing the structure of the touch sensor unit according to the present invention.
Figure 7B:
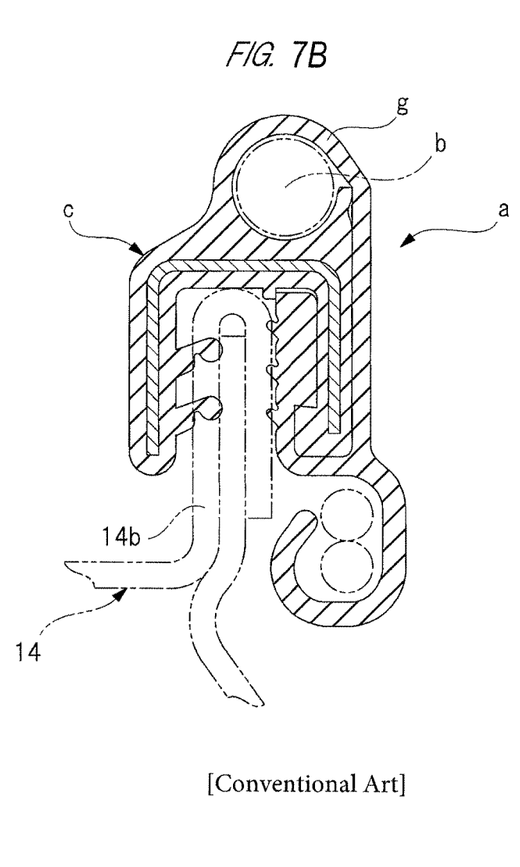
FIG. 7B is a sectional view showing the structure of a touch sensor unit of one related art.
Figure 8:
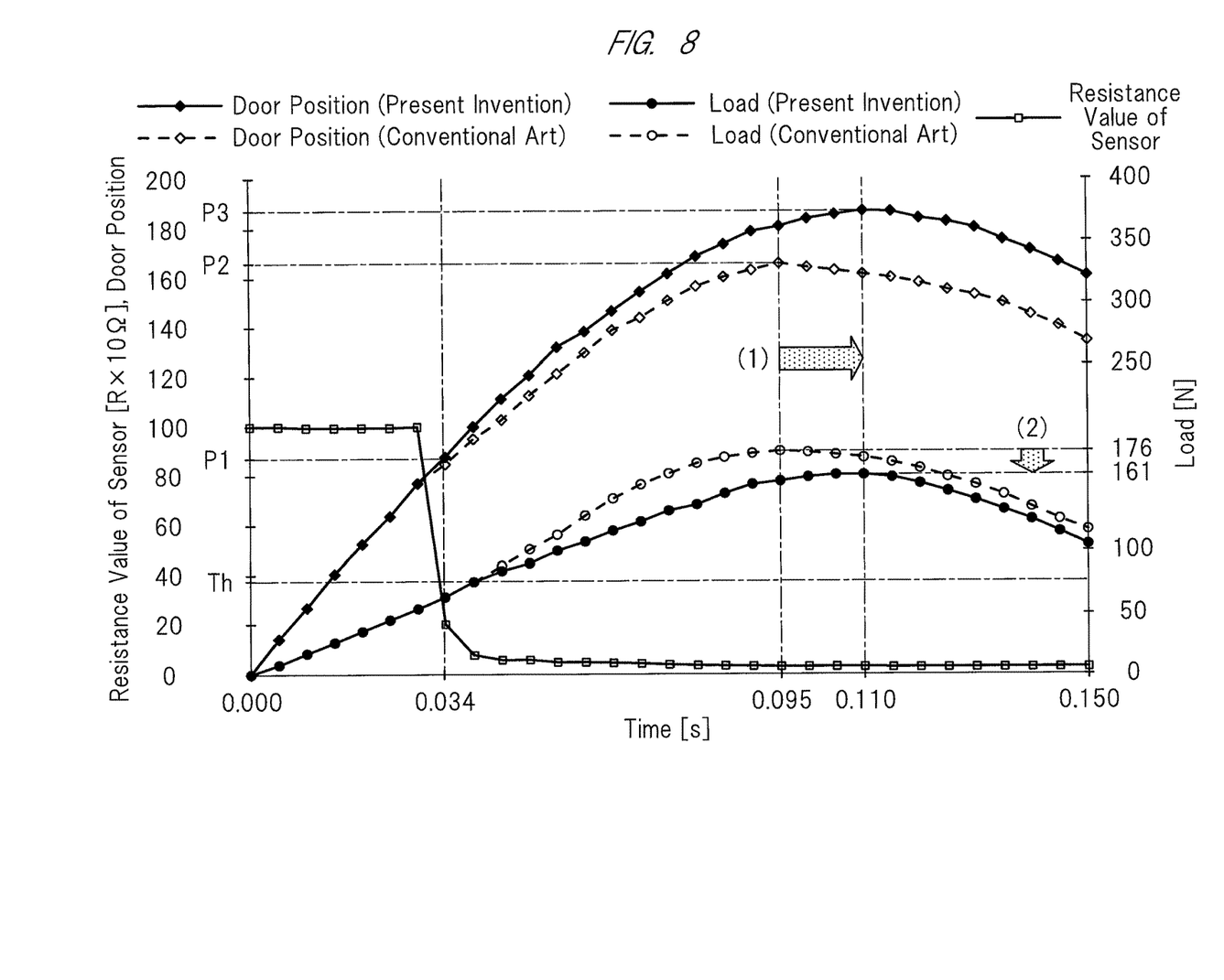
FIG. 8 is a graph for comparting characteristics of the touch sensor unit according to the present invention and characteristics of the touch sensor unit of the related art.

FIG. 1 is a side view showing a vehicle including a touch sensor unit according to the present invention; FIG. 2 is a diagram describing the structure of an automatic opening and closing apparatus provided to the vehicle; FIG. 3 is a sectional view showing the structure of the touch sensor unit; FIG. 4 is an enlarged sectional view showing a portion surrounded by a broken-line circle "A" of FIG. 3; FIG. 5 is a perspective view showing the structure of a cable sensor; FIG. 6 is a diagram describing the shape of a sensor holder after injection molding; FIG. 7A is a sectional view showing the structure of the touch sensor unit according to the present invention, and FIG. 7B is a sectional view showing the structure of a touch sensor unit of one related art; FIG. 8 is a graph for comparting characteristics of the touch sensor unit according to the present invention and characteristics of the touch sensor unit of the related art.

As shown in FIG. 1, a vehicle 10 is a passenger vehicle of a so-called minivan type including an engine room and a passenger compartment (not shown in detail). On a side portion 12 of a vehicle body 11 forming part of the vehicle 10, an opening portion 13 is provided. The opening portion 13 is opened and closed by a sliding door (opening and closing body or fixing object) 14 which slides (moves) in a longitudinal direction of the vehicle body 11 as indicated by a bold double-headed arrow in FIG. 1.

As shown in FIG. 2, a roller assembly 15 is provided to the sliding door 14. The roller assembly 15 is guided to a guide rail 16 fixed to the side portion 12 of the vehicle body 11, thereby causing the sliding door 14 to slide between a "full-open position" indicated by a solid line and a "full-close position" indicated by a two-dot chain line in FIG. 2. Also, on a vehicle-body front side of the guide rail 16, a curved portion 16a curved to a vehicle's inner side (upper side in FIG. 2) is provided. Therefore, the roller assembly 15 is guided to the curved portion 16a, and the sliding door 14 is drawn to the vehicle's inner side so as to be flush with the side portion 12 of the vehicle body 11 and is closed.

Here, the roller assembly 15 is also provided at each of upper and lower portions on the same side as a front end of the sliding door 14 in addition to the location shown in FIG. 2. Correspondingly to these, a guide rail is provided also at each of upper and lower portions of the opening portion 13 of the vehicle body 11. In this manner, the sliding door 14 is supported to the vehicle body 11 at three locations in total. Therefore, the sliding door 14 can make a stable sliding motion.

As shown in FIG. 2, an automatic opening and closing apparatus 20 which automatically opens and closes the sliding door 14 is mounted on the vehicle body 11. The automatic opening and closing apparatus 20 includes a drive unit 21 fixed to the vehicle body 11 adjacently to a substantially center portion of the guide rail 16 in a longitudinal direction of the vehicle body. From the drive unit 21, cables 22 and 23 are drawn out toward front and rear sides of the vehicle body.

The cable 22 drawn out from the drive unit 21 to the front side of the vehicle body is connected to the roller assembly 15 from the front side of the vehicle body via an inversion pulley 24 provided to a front end portion of the guide rail 16. On the other hand, the cable 23 drawn out from the drive unit 21 to the rear side of the vehicle body is connected to the roller assembly 15 from the rear side of the vehicle body via an inversion pulley 25 provided to a rear end portion of the guide rail 16.

When the cable 22 or 23 is driven by the drive unit 21, the sliding door 14 is pulled by the relevant one of the cables 22 and 23 provided on the front and rear sides of the vehicle body to be automatically opened or closed. That is, the automatic opening and closing apparatus 20 is a so-called cable-type automatic opening and closing apparatus.

The drive unit 21 is an electric motor. As its drive source, for example, brush-equipped or brushless direct-current motor which can rotate in both forward and reverse directions is used. A drum (not shown) with wounded cables 22 and 23 is accommodated inside the drive unit 21. Therefore, when the drive unit 21 is driven in a forward direction, the drum rotates in one direction to cause the cable 22 to be wound around the drum, the sliding door 14 is pulled and closed by the cable 22. Conversely, when the drive unit 21 is driven in a reverse direction, the drum rotates in the other direction to cause the cable 23 to be wound around the drum, the sliding door 14 is pulled and opened by the cable 23.

To the drive unit 21, a controller 30 for controlling the drive unit 21 is connected via a connection cable 31. The controller 30 includes a CPU, and memories such as ROM, RAM, and so forth (any of these not shown) and, furthermore, includes a decision circuit (not shown) which decides a state of a cable sensor 50 (see FIG. 5), which will be described further below, on the basis of a current value signal. Here, the state of the cable sensor 50 refers to a state in which a blockage DA makes contact with the touch sensor unit 40 as shown in FIG. 1 or the cable sensor 50 is broken (failed).

The sliding door 14 is provided with a door handle 14a to be operated by an operator. The door handle 14a includes a function as an "opening and closing switch" for opening and closing the sliding door 14. When the door handle 14a is operated by the operator, an opening and closing signal is outputted from the door handle 14a to the controller 30. Then, the controller 30 controls the drive unit 21 on the basis of an input of the opening and closing signal and so forth.

For example, when the door handle 14a is operated and an instruction signal indicating that the sliding door 14 is to be closed (closing motion signal) is inputted to the controller 30, the drive unit 21 is driven by the controller 30 in the forward direction. Therefore, the sliding door 14 is closed. Conversely, when the door handle 14a is operated and an instruction signal indicating that the sliding door 14 is to be opened (opening motion signal) is inputted to the controller 30, the drive unit 21 is driven by the controller 30 in the reverse direction. Therefore, the sliding door 14 is opened.

As shown in FIG. 3, a bracket portion 14b protruding toward the front of the vehicle body is provided to the sliding door 14 on the front side of the vehicle body. On the bracket portion 14b, a touch sensor unit 40 is mounted. That is, the touch sensor unit 40 is fixed to a front end of the sliding door 14 in a closing direction. The touch sensor unit 40 detects a contact of a blockage DA (see FIG. 1) with the sliding door 14, and includes the cable sensor 50 to be elastically deformed by the blockage DA and a sensor holder 60 for fixing the cable sensor 50 to the bracket portion 14b while holding the cable sensor 50.

As shown in FIG. 5, the cable sensor 50 includes a hollow sheathing member 51 with its section formed into a substantially circular shape. At a center portion of the sheathing member 51, a spacer member 52 with its section formed into a substantially circular shape is disposed. The spacer member 52 is extended straight in a direction in which the sheathing member 51 extends. Also, inside the sheathing member 51 and around the spacer member 52, four electrodes 53, 54, 55, and 56 each with its section formed into a substantially circular shape are spirally provided. These electrodes 53, 54, 55, and 56 are equidistantly wound around the spacer member 52.

Note that the spacer member 52 and the respective electrodes 53, 54, 55, and 56 are held by the sheathing member 51, and the four electrodes 53, 54, 55, and 56 are fixed with bonding agent or the like (not shown) around the spacer member 52. Additionally, instead of fixing them with bonding agent or the like, four spiral grooves (not shown) may be formed around the spacer member 52 and the four electrodes 53, 54, 55, and 56 may be disposed in these spiral grooves. However, it is desirable to reduce the depth dimension of each spiral groove in this case as much as possible so that the electrodes disposed adjacent to each other can easily make contact with each other when external force is applied to the sheathing member 51.

The sheathing member 51 is formed into a tube shape and made of flexible insulating material, and the sheathing member 51 has a thickness dimension along a radial direction of the sheathing member 51 equal at every position of the sheathing member 51 in a circumferential direction. Therefore, sensitivities of the cable sensor 50 in from all directions are substantially the same as each other. When external force is applied from the radial direction of the sheathing member 51, the sheathing member 51 is elastically deformed. When external force to the sheathing member 51 is removed, the sheathing member 51 recovers its original shape. Note that, in states shown in FIGS. 3 to 5, no external force is applied to the sheathing member 51.

As material of the sheathing member 51, it is possible to use resilient rubber, resilient plastic, or the like. Resilient rubber may include for example silicone rubber, ethylene-propylene rubber, styrene-butadiene rubber, chloroprene rubber. Resilient plastic may include polyethylene, ethylene vinyl acetate copolymer, ethylene ethyl acrylate copolymer, ethylene methyl methacrylate copolymer, polypropylene, polyvinyl chloride, olefin-based or styrene-based thermoplastic elastomer.

The spacer member 52 includes a function of holding the respective electrodes 53, 54, 55, and 56 one another in a non-contact state under circumstances where the sheathing member 51 is not elastically deformed. The spacer member 52 includes a core member 52a and a sheathing layer 52b which sheathes the periphery of the core member 52a. The core member 52a is to ensure stiffness of the spacer member 52 and prevent easy expansion and contraction. The sheathing layer 52b is elastically deformed when external force is applied, and recovers its original shape when the external force is removed. As material of the sheathing layer 52b, an insulating material identical to the sheathing member 51 can be used.

The four electrodes 53, 54, 55, and 56 are each set to have the same outer diameter, and each have conductivity and flexibility. The electrodes 53, 54, 55, and 56 are respectively composed of conductors 53a, 54a, 55a, and 56a excellent in conductivity such as copper and outer circumferential layers 53b, 54b, 55b, and 56b which sheath the outer circumferences of these conductors 53a, 54a, 55a, and 56a.

The conductors 53a, 54a, 55a, and 56a are each formed by twisting a plurality of metal fine wires as shown in FIG. 5. Therefore, predetermined durability is obtained with respect to elastic deformation of each of the electrodes 53, 54, 55, and 56. However, as material of the conductors 53a, 54a, 55a, and 56a, not only copper or the like but also another conductive material may be used. Furthermore, instead of twisting a plurality of metal fine wires, one conductor may be used.

For each of the outer circumferential layers 53b, 54b, 55b, and 56b, as with the case of the sheathing member 51, resilient rubber, resilient plastic, or the like can be used. However, in each of the outer circumferential layers 53b, 54b, 55b, and 56b, a predetermined amount of a conductive filler (not shown) such as carbon black is mixed in order to provide conductivity.

On one end side of each of the electrodes 53, 54, 55, and 56 in a longitudinal direction, a detection resistor (not shown) as an "electrical component" is provided. On the other hand, on the other end side of each of the electrodes 53, 54, 55, and 56, as shown in FIG. 2, the controller 30 is connected via a connection cable 32. Here, in a normal state in which no external force is applied to the cable sensor 50, the decision circuit of the controller 30 detects a current value signal having a value small enough to pass through the detection resistor, thereby deciding that no external force is applied to the cable sensor 50.

On the other hand, when external force is applied to the cable sensor 50 to elastically deform the cable sensor 50, electrodes disposed adjacent to each other inside the sheathing member 51 make contact with each other (short-circuited). Therefore, the decision circuit of the controller 30 detects a current value signal having a value large enough not to pass through the detection resistor (short-circuited state) and decides that external force is applied to the cable sensor 50, that is, the blockage DA (see FIG. 1) makes contact.

The touch sensor unit 40 includes a sensor holder 60 formed of flexible insulating rubber material or the like. The sensor holder 60 is formed so as to be long in accordance with the dimension of the sliding door 14 in the longitudinal direction (dimension in the vertical direction of FIG. 1). The sectional shape along a direction crossing the longitudinal direction of the sensor holder 60 is identical over the entire region along the longitudinal direction of the sensor holder 60.

As shown in FIGS. 3 and 4, the sensor holder 60 includes: a sensor accommodating portion 61 having a section formed into a substantially circular shape; a fixing portion 62 integrally provided to the sensor accommodating portion 61 and having a section formed into a substantially U-shape; and a shock absorbing portion 63 provided between the sensor accommodating portion 61 and the fixing portion 62.

The sensor accommodating portion 61 is formed of (soft) insulating rubber material and formed into a hollow shape, the insulating rubber material being lower in hardness than those of the fixing portion 62 and the shock absorbing portion 63, and more easily deformed by application of external force, compared with the fixing portion 62 and the shock absorbing portion 63. A portion indicated by a sign BL in FIGS. 3 and 4 indicates a boundary portion between insulating rubber materials with different hardnesses.

The sensor accommodating portion 61 has an inner diameter dimension which is slightly larger than the outer diameter dimension of the cable sensor 50. Therefore, a slight gap is formed between the sensor accommodating portion 61 and the cable sensor 50, thereby making it easy for the cable sensor 50 to be accommodated in the sensor accommodating portion 61. Noted that, when the cable sensor 50 is accommodated in the sensor accommodating portion 61, lubricating grease (not shown) for smoothing sliding of both is used.

The sensor accommodating portion 61 has a thickness dimension (material thickness) t1 along a direction crossing the longitudinal direction of the cable sensor 50, which is slightly thicker than a thickness dimension (material thickness) t2 of the sheathing member 51 in the cable sensor 50 (t1>t2). Note that insulating rubber material forming the sensor accommodating portion 61 is lower in hardness (softer) than insulating material forming the sheathing member 51. Therefore, the sensor accommodating portion 61 is elastically deformed with ease by application of external force, and even small external force is reliably transmitted to the cable sensor 50.

Furthermore, the thickness dimension t1 of the sensor accommodating portion 61 is thinner than the thickness dimension (material thickness) t3 of each of first and second bridging portions 63a and 63b (shock absorbing portion 63) along the direction crossing the longitudinal direction of the cable sensor 50 (t1<t3). Furthermore, the sensor accommodating portion 61 is softer than the first and second bridging portions 63a and 63b. Therefore, after the sensor accommodating portion 61 is elastically deformed by application of external force, the shock absorbing portion 63 is elastically deformed subsequently.

As shown in FIG. 3, the fixing portion 62 is used to be fixed to the bracket portion 14b, and includes a base portion 62a extending in a direction crossing an extending direction of the bracket portion 14b. On a vehicle's inner side (right side in FIG. 3) of the base portion 62a, a first extending portion 62b extending in the extending direction of the bracket portion 14b, that is, in a moving direction of the sliding door 14, is integrally provided. Also, on a vehicle's outer side (left side in FIG. 3) of the base portion 62a, a second extending portion 62c extending in the extending direction of the bracket portion 14b, that is, the moving direction of the sliding door 14, is integrally provided. In this manner, the base portion 62a is provided so as to go between inside (vehicle's inner side) and outside (vehicle's outer side) of the sliding door 14 in a state where the touch sensor unit 40 is fixed to the bracket portion 14b.

The first and second extending portions 62b and 62c both extend in the same direction from the base portion 62a. Specifically, the first and second extending portions 62b and 62c extend to a rear side of the vehicle body so as to interpose the bracket portion 14b therebetween. Also, in a state where the touch sensor unit 40 is mounted on the bracket portion 14b, a first extending portion 62b side of the base portion 62a is disposed on the rear side of the vehicle body (lower side in FIG. 3), and a second extending portion 62a side of the base portion 62a is disposed on the front side of the vehicle body (upper side in FIG. 3). Therefore, the base portion 62a is tilted without being orthogonal to a mount center FC of the bracket portion 14b. In other words, the first extending portion 62b is disposed on the same side as a rear end along the closing direction of the sliding door 14 (upper direction in FIG. 3), and the second extending portion 62c is disposed on the same side as a front end along the closing direction of the sliding door 14.

As shown in FIG. 3, the shock absorbing portion 63 and the sensor accommodating portion 61 are disposed (upper side in FIG. 3) on the opposite side of the base portion 62a from the first and second extending portions 62b and 62c and on the same side as the vehicle interior. In this manner, with the shock absorbing portion 63 and the sensor accommodating portion 61 provided on the same side as the first extending portion 62b of the base portion 62a, the sensor accommodating portion 61 is prevented from significantly protruding to the front side of the vehicle body. That is, an increase in height dimension of the touch sensor unit 40 along the longitudinal direction is inhibited as much as possible.

The first extending portion 62b is provided with paired retaining pieces 62d which are aligned in the extending direction of the first extending portion 62b. A tip side of the retaining pieces 62d is oriented on the same side as the second extending portion 62c and on the front side of the vehicle body. Therefore, the bracket portion 14b inserted between the first extending portion 62b and the second extending portion 62c from the rear side of the vehicle body is reliably retained by the first and second extending portions 62b and 62c. Furthermore, a cable accommodating portion 62e is integrally provided to a tip side (lower side in FIG. 3) of the first extending portion 62b, and the connection cable 32 (see FIG. 2) for electrically connecting the cable sensor 50 and the controller 30 to each other is partially accommodated in the cable accommodating portion 62e, thereby enhancing the appearance of the circumference of the touch sensor unit 40.

The second extending portion 62c is provided with a pair of support protrusions 62f, and aligned in the extending direction of the second extending portion 62c. These support protrusions 62f serve a function reducing a contact area between the second extending portion 62c and the bracket portion 14b, thereby facilitating attachment of the bracket portion 14b between the first extending portion 62b and the second extending portion 62c. Furthermore, a sealing piece 62g is integrally provided to a tip side (lower side in FIG. 3)

of the second extending portion 62c, and with the sliding door 14 closed, the sealing piece 62g is closely attached to a front door, a center pillar, and so forth (not shown) to closely seal the opening portion 13 (see FIG. 1).

Inside the fixing portion 62, a core rod 64 for reinforcing the fixing portion 62 to enhance stiffness of the fixing portion 62 is buried (inserted). The core rod 64 has a section formed into a substantially U-shape based on the shape of the fixing portion 62, and includes: a base reinforcing portion 64a corresponding to the base portion 62a; a first reinforcing portion 64b corresponding to the first extending portion 62b; and a second reinforcing portion 64c corresponding to the second extending portion 62c. However, since both the cable accommodating portion 62e of the first extending portion 62b and the sealing piece 62g of the second extending portion 62c require flexibility, the core rod 64 is not buried inside the cable accommodating portion 62e and the sealing piece 62g.

As shown in FIGS. 3 and 4, the shock absorbing portion 63 is provided between the sensor accommodating portion 61 and the fixing portion 62 of the sensor holder 60. The shock absorbing portion 63 includes the paired first and second bridging portions 63a and 63b. The first and second bridging portions 63a and 63b keep a distance between the fixing portion 62 and the sensor accommodating portion 61 at a predetermined distance, and form a shock absorbing space (gap) 63c between the fixing portion 62 and the sensor accommodating portion 61.

The first and second bridging portions 63a and 63b extend in the moving direction of the sliding door 14. One end of each of the first and second bridging portions 63a and 63b in a longitudinal direction thereof is coupled to the sensor accommodating portion 61, and the other end of each of the first and second bridging portions 63a and 63b in the longitudinal direction is coupled to the base portion 62a of the fixing portion 62. The first bridging portion 63a is provided to a portion facing the first extending portion 62b along the moving direction of the sliding door 14, and the second bridging portion 63b is provided to a portion facing the base portion 62a along the moving direction of the sliding door 14.

As shown in FIG. 4, the thickness dimension t3 of each of the first and second bridging portions 63a and 63b along the direction crossing the longitudinal direction of the cable sensor 50 is the thickest among elastic deformation portions of the touch sensor unit 40 (t3>t1>t2). Therefore, since after the sensor accommodating portion 61 and the cable sensor 50 are elastically deformed and a contact of the blockage DA (see FIG. 1) is detected by the controller 30 (see FIG. 2), the shock absorbing portion 63 (the first and second bridging portions 63a and 63b and the shock absorbing space 63c) is elastically deformed, a shock transmitted to the blockage DA can be buffered by inertial force of the sliding door 14.

The sensor holder 60 of the touch sensor unit 40 is extruded into a shape as shown in FIG. 6. In the following, an extruding process for the sensor holder 60 and a forming process to be performed after extrusion will be described with reference to the drawings.

[Extruding Process]

As shown in FIG. 6, a metallic mold 70 for molding the sensor holder 60 is provided with a hollow portion 71 having a sectional shape based on the sectional shape of the sensor holder 60. The hollow portion 71 includes a first hollow portion 71a and a second hollow portion 71b. The core rod 64 and high-hardness insulating rubber material HR are supplied to the first hollow portion 71a, thereby forming the fixing portion 62 and the shock absorbing portion 63. On the other hand, low-hardness insulating rubber material SR is supplied to the second hollow portion 71b, so that the sensor accommodating portion 61 is formed of this material.

Note that in a stage before the forming process, as shown in FIG. 6, in the core rod 64, an angle formed between the base reinforcing portion 64a and the first reinforcing portion 64b and an angle formed between the base reinforcing portion 64a and the second reinforcing portion 64c are set equal to a degrees (obtuse angle of approximately 107 degrees). Therefore, by distributing uniformly insulating rubber material HR to the periphery of the core rod 64, it is possible to improve molding accuracy of the sensor holder 60.

Furthermore, by setting the angle formed between the base reinforcing portion 64a and the first reinforcing portion 64b and the angle formed by the base reinforcing portion 64a and the second reinforcing portion 64c equal to a degrees, a relatively large clearance "S" is formed between the retaining pieces 62d and the support protrusions 62f in the sensor holder 60 before the forming process. In this manner, by keeping a sufficient strength of a portion forming the clearance "S" of the metallic mold 70, it is possible to secure longevity (improve reusability) of the metallic mold 70.

[Forming Process]

After the extruding process, the sensor holder 60 is subjected to the forming process for forming the shape shown in FIG. 6 into the shape shown in FIG. 3. In this forming process, the core rod 64 is folded so that the angle formed between the base reinforcing portion 64a and the second reinforcing portion 64c is set equal to (approximately 72 degrees) or smaller than a degrees, thereby making the first extending portion 62b and the second extending portion 62c parallel to each other. Therefore, the forming process for the sensor holder 60 after the extruding process is completed.

At this time, a center line C1 of the second reinforcing portion 64c and a center line C2 of the second bridging portion 63b are in a state offset by a distance L. Therefore, because of the forming process, the second bridging portion 63b is not pulled, consequently elastically deformed. That is, it is possible to prevent variation from product to product in load causing a deformation of the shock absorbing portion 63 by external force from being caused by elastic deformation of the second bridging portion 63b. Furthermore, the position of the sensor accommodating portion 61 with respect to the fixing portion 62 is not varied from product to product, thereby improving yield ratio. In order to achieve this feature, the second bridging portion 63b is provided to a portion facing the base portion 62a along the moving direction of the sliding door 14 (see FIG. 3) and at a position offset from the second reinforcing portion 64c.

Next, the operation of the above-formed touch sensor unit 40 will be described in detail with reference to the drawings. In the following description, to clarify differences from related art, the operation of the touch sensor unit 40 of the present invention is described in comparison with the touch sensor unit "a" of related art shown in FIG. 9.

As shown in FIGS. 7A and 7B, the touch sensor unit 40 of [Present Invention] and the touch sensor unit "a" of [Related Art] are mounted on respective vehicles so that a tip portion of the touch sensor unit 40 of [Present Invention] and a tip portion of the touch sensor unit "a" of [Related Art] become the same in position as each other. FIG. 8 is a graph which is obtained on the assumption that, in both [Present Invention] and [Related Art], the sliding door 14 is moved in the closing direction under the same conditions, and from a state shown in FIGS. 7A and 7B, the same side of the sliding door 14 as the front side of the vehicle body along the closing direction of the sliding door 14 makes contact with the blockage DA (see FIG. 1).

As shown in FIG. 8, in both [Present Invention] and [Related Art], immediately after the start of movement of the sliding door 14 in the closing direction, the sensor accommodating portion 61 and the sensor holding portion "g" (see FIG. 7B) start warping. Then, with elastic deformation of the sensor accommodating portion 61 and a sensor holding portion "g", the cable sensor 50 and the cable sensor "b" are elastically deformed. Then, the electrodes of the cable sensor 50 and the electrodes of the cable sensor "b" make contact with each other, and causes the resistance value of each sensor to rapidly fall below an ON threshold Th. Then, after a control delay (micro time), the controller 30 (see FIG. 2) recognizes a contact of the blockage DA (ON recognition) at the time of approximately 0.034 [s] after the start of movement of the sliding door 14. In this manner, in both [Present Invention] and [Related Art], the time needed to recognize a contact of the blockage DA is approximately the same as each other. The position (door position) of the sliding door 14 at the time of ON recognition is the same as the movement position P1 immediately after the start of movement.

Note that, in practice, even after the controller 30 makes an ON recognition, the sliding door 14 is slightly moved in the closing direction due to the control delay of the controller 30, an inertial force of the sliding door 14, and the operation of a tensioner mechanism (not shown) incorporated in the drive unit 21. In this time, in [Present Invention], the shock absorbing portion 63 is elastically deformed. Therefore, as shown in FIG. 8, a maximum load is applied from the sliding door 14 to the blockage DA at the time of approximately 0.095 [s] in [Related Art], and a maximum load is applied from the sliding door 14 to the blockage DA at the time of approximately 0.110 [s] in [Present Invention]. In this manner, in [Present Invention], as indicated by a hatched arrow (1) in FIG. 8, the reaching time of the maximum load from the sliding door 14 to the blockage DA is delayed by elastic deformation of the shock absorbing portion 63, and a shock by the sliding door 14 is absorbed in a differential time of approximately 0.015 [s]. In [Present Invention], due to elastic deformation of the shock absorbing portion 63, a maximum movement position P3 of the sliding door 14 is slightly closer to the front side of the vehicle body than a maximum movement position P2 of [Related Art].

In this manner, in [Present Invention], compared with [Related Art], a load on it at the time of halt or the like of the drive unit 21 (see FIG. 2) is reduced from 176 [N] to 161[N], as indicated by a hatched arrow (2) in FIG. 8, thereby reducing a load on the blockage DA. In addition, it is possible to protect the drive unit 21 and other mechanisms by preventing a large load from being applied to them.

As described above in detail, according to the touch sensor unit 40 of the present embodiment, the first and second bridging portions 63a and 63b are provided, which are elastically deformed by application of external force so as to form the shock absorbing space 63c between the sensor accommodating portion 61 and the fixing portion 62. Therefore, the first and second bridging portions 63a and 63b (and the shock absorbing space 63c) can be caused to function as the shock absorbing portion 63. Furthermore, since the thickness dimension t1 of the sensor accommodating portion 61 is thinner than the thickness dimension t3 of each of the first and second bridging portions 63a and 63b, after the sensor accommodating portion 61 is elastically deformed and a contact of the blockage DA is detected, the first and second bridging portions 63a and 63b can be elastically deformed to absorb a shock. Therefore, a load on the blockage DA can be significantly reduced ever before. Here, since the drive unit 21 is, for example, reversely driven, after shock absorption, the load on the drive unit 21 and so forth can be reduced, and occurrence of inconvenience such as burning can be inhibited.

Furthermore, according to the touch sensor unit 40 of the present embodiment, the base portion 62a of the fixing portion 62 is provided and tilted so that the first extending portion 62b is disposed on the same side as the rear end along the closing direction of the sliding door 14 and the second extending portion 62c is disposed on the same side as the front end along the closing direction of the sliding door 14, and the first and second bridging portions 63a and 63b and the sensor accommodating portion 61 are disposed on the same side as the first extending portion 62b of the base portion 62a. Therefore, the sensor accommodating portion 61 is prevented from significantly protruding toward the front side of the vehicle body, and an increase in height dimension of the touch sensor unit 40 along the longitudinal direction of the vehicle body is inhibited.

Furthermore, according to the touch sensor unit 40 of the present embodiment, the first bridging portion 63a is provided to a portion facing the first extending portion 62b along the moving direction of the sliding door 14, and the second bridging portion 63b is provided to a portion facing the base portion 62a along the moving direction of the sliding door 14. Therefore, in the forming process after the extruding process, the second bridging portion 63b is prevented from being pulled and elastically deformed, and the sensor holder 60 is prevented from being varied from product to product, thereby improving yield ratio.

Furthermore, according to the touch sensor unit 40 of the present embodiment, since the core rod 64 is buried in the fixing portion 62, the fixing portion 62 can be reinforced, the stiffness of the fixing portion 62 can be enhanced, and in turn, the sensor holder 60 can be reliably prevented from falling from the bracket portion 14b.

It is needless to say that the present invention is not to be limited to the described embodiments, alternations and/or modifications of the illustrated and/or described embodiments are contemplated as being alternative forms of the invention as far as they do not depart from the scope of the present invention, which is defined by the appended claims. For example, while the base portion 62a of the fixing portion 62 is tilted in the above-described embodiment, the present invention is not restricted to this and, when the present invention can support a large-sized sensor unit, the base portion can be provided horizontally in a direction orthogonal to the moving direction of the sliding door.

Also, while the cable sensor 50 is adopted for the sliding door 14 of the vehicle body 11 in the above-described embodiment, the present invention is not restricted to this embodiment, and can be adopted for a sunroof of the vehicle body 11 or a rear hatch at the rear of the vehicle body 11. Furthermore, the present invention can be adopted not only for an opening and closing body provided to the vehicle body 11 but also for an automatic door or the like which opens and closes a gateway of a building.

The touch sensor unit is used as being attached to a sliding door which opens and closes an opening portion of a vehicle body of an automobile or the like to detect a contact of a blockage.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A touch sensor unit for detection of contact with a blockage, comprising:
   a cable sensor having electrodes which are brought into electrical contact with each other by external force;
   a sensor accommodating portion in which the cable sensor is accommodated, and which is deformed by the external force;
   a fixing portion integrally provided to the sensor accommodating portion, and fixed to a fixing object, and
   a pair of bridging portions disposed so as to form a space between the sensor accommodating portion and the fixing portion, and elastically deformed by the external force,
   wherein the sensor accommodating portion has a thickness dimension along a direction crossing a longitudinal direction of the cable sensor, the thickness dimension being thinner than a thickness dimension of the bridging portions along the direction crossing the longitudinal direction of the cable sensor.

2. The touch sensor unit according to claim 1, wherein the fixing object is an opening and closing body which opens and closes an opening portion, and
   the fixing portion includes: a base portion formed between inside and outside of the opening and closing body; a first extending portion extending in a moving direction of the opening and closing body on an inside of the opening and closing body; and a second extending portion extending in the moving direction of the opening and closing body on an outside of the opening and closing body.

3. The touch sensor unit according to claim 2, wherein the base portion is tilted so that the first extending portion is disposed near a rear end along a closing direction of the opening and closing body, and the second extending portion is disposed near a front end along the closing direction of the opening and closing body, and
   the paired bridging portions and the sensor accommodating portion are disposed near the first extending portion of the base portion.

4. The touch sensor unit according to claim 2, wherein one of the paired bridging portions is provided to a corresponding portion of the first extending portion along the moving direction of the opening and closing body, and
   the other of the paired bridging portions is provided to a corresponding portion of the base portion along the moving direction of the opening and closing body.

5. The touch sensor unit according to claim 2, wherein a core rod is buried in the fixing portion.

* * * * *